(12) United States Patent
Naka et al.

(10) Patent No.: US 6,734,817 B2
(45) Date of Patent: May 11, 2004

(54) A/D CONVERTER, METHOD OF A/D CONVERSION, AND SIGNAL PROCESSING DEVICE

(75) Inventors: Junichi Naka, Osaka (JP); Yoshitsugu Inagaki, Osaka (JP); Hiroshi Sakura, Osaka (JP); Heiji Ikoma, Nara (JP); Koji Oka, Osaka (JP); Youichi Okamoto, Osaka (JP); Daisuke Nomasaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/328,159

(22) Filed: Dec. 26, 2002

(65) Prior Publication Data

US 2003/0128145 A1 Jul. 10, 2003

(30) Foreign Application Priority Data

Dec. 26, 2001 (JP) .......................... 2001-393582

(51) Int. Cl.$^7$ .............................................. H03M 1/12
(52) U.S. Cl. ................... 341/155; 341/131; 341/139; 341/143; 341/159; 330/86; 330/129; 330/282
(58) Field of Search ................... 341/131, 139, 341/155, 159; 330/86, 129, 282

(56) References Cited

U.S. PATENT DOCUMENTS

| | | | | | |
|---|---|---|---|---|---|
| 5,408,233 A | * | 4/1995 | Gannon et al. | ............. | 341/131 |
| 5,691,720 A | * | 11/1997 | Wang et al. | ................. | 341/143 |
| 5,818,374 A | * | 10/1998 | Tan | ............................ | 341/143 |
| 5,844,512 A | * | 12/1998 | Gorin et al. | ................ | 341/139 |
| 5,892,472 A | * | 4/1999 | Shu et al. | .................... | 341/139 |
| 5,982,315 A | * | 11/1999 | Bazarjani et al. | ........... | 341/143 |
| 6,292,120 B1 | * | 9/2001 | Painchaud et al. | ......... | 341/139 |
| 2002/0008788 A1 | * | 1/2002 | Talmola et al. | ............. | 348/732 |
| 2002/0149507 A1 | * | 10/2002 | Kaul et al. | .................. | 341/159 |

* cited by examiner

Primary Examiner—Michael Tokar
Assistant Examiner—Khai M Nguyen
(74) Attorney, Agent, or Firm—McDermott, Will & Emery (57) ABSTRACT

When the performance of an A/D converter required by a system changes, power consumption of the overall system can be reduced. The resolution of an A/D converter is made variable by changing a current flowing through an amplifier by an external control signal that specifies the resolution. Thus, when the performance required by a system changes, it is possible to change the performance of the A/D converter and to prevent a performance overhead of the A/D converter. Consequently, power consumption of the A/D converter is reduced, and power consumption of the system as a whole is also reduced.

6 Claims, 12 Drawing Sheets

A/D CONVERTER, METHOD OF A/D CONVERSION, AND SIGNAL PROCESSING DEVICE

BACKGROUND OF THE INVENTION

The present invention relates to analog-to-digital (A/D) converters, methods of A/D conversion, and signal processing devices.

In the information and communication field, signal processing has demanded digital processing, faster speeds, and broader bandwidths, and information and communication devices have required reduced sizes and weight. These trends have required A/D converters, which are crucial devices to the digital signal processing, to have faster speeds, broader bandwidths, and lower power consumption. Various components in A/D converters employ operational amplifiers, each of which serves a very important function. Examples of the operational amplifiers incorporated in A/D converters include a comparator, which compares a supplied analog input voltage with a reference voltage, a sample-and-hold circuit, which performs a sampling and holding operation of an input signal in order to achieve a faster speed and a broader bandwidth, a differential signal amplifier circuit, which is used for, for example, the signal amplification in a pipeline A/D converter, and the like.

Figure 13:
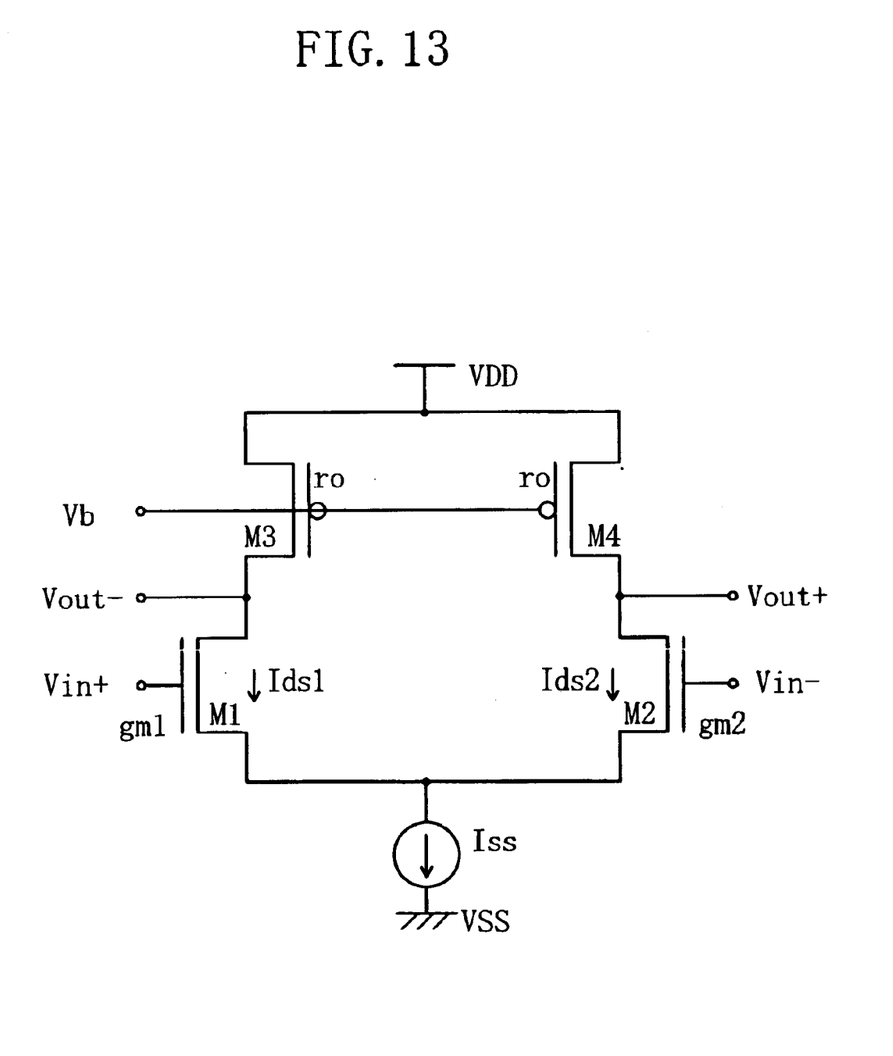
FIG. 13 is a schematic diagram showing an operational amplifier in a conventional A/D converter.

FIG. 13 shows an example of the differential input-differential output operational amplifier used for A/D converters. The present circuit is biased by a constant current source Iss. The gate terminals of N-channel transistors M1 and M2, which are input transistors, are respectively connected to an analog differential input signal-positive electrode Vin$^+$ and an analog differential input signal-negative electrode Vin$^-$. The source terminals of the N-channel transistors M1 and M2 are connected to a reference voltage VSS. The gate terminals of P-channel transistors M3 and M4 are connected to a bias voltage Vb. The source terminals of the P-channel transistors M3 and M4 are connected to a power supply voltage VDD. The drain terminals of the N-channel transistor M1 and the P-channel transistor M3 are connected to an analog differential output signal-negative electrode Vout$^-$. The drain terminals of the N-channel transistor M2 and the P-channel transistor M4 are connected to an analog differential output signal-positive electrode Vout$^+$.

By the voltage-current conversion function of the N-channel transistors M1 and M2, an analog differential input signal $\Delta Vin=(Vin^+-Vin^-)$ is converted into a difference current $\Delta Ids$ between a drain-source current Ids1 that flows in the N-channel transistor M1 and a drain-source current Ids2 that flows in the N-channel transistor M2 ($\Delta Ids=(Ids1-Ids2)$). The deltas $\Delta Ids1$ and $\Delta Ids2$ of the drain-source current Ids1 and the drain-source current Ids2 are obtained by the following equations: $\Delta Ids1=gm1(\Delta Vin/2)$ and $\Delta Ids2=gm2(\Delta Vin/2)$, respectively, where gm1 is the transconductance of the N-channel transistor M1 and gm2 is the transconductance of the N-channel transistor M2. Given that the N-channel transistors M1 and M2 have the same characteristics, gm=gm1=gm2. Where the dynamic resistance of the output terminal is denoted by ro, an analog differential output signal $\Delta Vout=(\Delta Vout^+-\Delta Vout^-)$ is obtained by the following equation: $\Delta Vout=gm \cdot \Delta Vin \cdot ro$. Accordingly, a voltage gain G of the present circuit can be obtained by the following equation: $G=\Delta Vout/\Delta Vin=gm \cdot ro$.

In other words, the voltage gain G of the operational amplifier is proportional to the transconductance gm of the N-channel transistors M1 and M2, which are input transistors. Moreover, the transconductance gm is approximately proportional to the drain-source current Ids flowing in the transistors. Therefore, in order to increase the voltage gain G, it is necessary to increase the drain-source current Ids.

To achieve a higher-resolution and faster-speed A/D converter, it is necessary to increase precision, gain, and speed of the operational amplifier.

Generally, operational amplifiers are operated at a constant current biased state. Accordingly, power consumption of an operational amplifier is approximately constant at all times.

As discussed above, in conventional A/D converters, the current flowing through the operational amplifier that is incorporated in an A/D converter does not change, and consequently, the performance of the A/D converter per se does not change even when the system requires a change in performance of the A/D converter. Generally, the performance of an A/D converter is approximately correlated with the power consumption. For these reasons, conventional A/D converters have at least the following problem. When the performance of the A/D converter is higher than the required performance of the A/D converter that is required by the system (when a performance overhead occurs), the A/D converter consumes electric power wastefully.

SUMMARY OF THE INVENTION

In view of the foregoing and other problems, it is an object of the present invention to reduce the power consumption of the overall system when the system requires a change in the performance of an A/D converter.

This and other objects are accomplished by the following aspects of the invention. More specifically, in accordance with one aspect, the present invention provides an A/D converter wherein its resolution is made variable by changing a current flowing through an amplifier with a control signal that specifies the resolution.

The invention also provides an A/D converter comprising: a controlling means for determining a resolution; an amplifier for changing a current with a signal from the controlling means; and a voltage comparator array to which an output from the amplifier is input; wherein the resolution is corrected by inputting the result of the comparison in the voltage comparator array into the controlling means.

In accordance with another aspect, the present invention also provides a signal processing device comprising: the above-described A/D converter; a signal processing means in which part of the performance is determined by the resolution of the A/D converter; a monitoring means for monitoring the performance of the signal processing means attributable to the resolution of the A/D converter and instructing the A/D converter to increase the resolution if a decrease of the performance is detected and to reduce the resolution if an overhead of the performance is detected. Preferably, the signal processing means is a digital demodulator circuit; and the performance is a bit error rate of the digital demodulator circuit.

In accordance with further another aspect, the present invention provides a method of A/D conversion, comprising: a voltage-inputting step of inputting a test voltage in an amplifier; a comparing step of comparing the voltage that is output from the amplifier with the test voltage; and a resolution-determining step of adjusting a current value of the amplifier according to the result obtained in the comparing step.

As described above, when the performance required by a system changes, the performance of the A/D converter can be changed according to the status of the system, and as a consequence, performance overheads can be prevented in A/D converters. Thus, power consumption of A/D converters can be reduced, and accordingly, power consumption of the whole system can be reduced.

DETAILED DESCRIPTION OF THE INVENTION

Hereinbelow, preferred embodiments of the present invention are detailed.

Embodiment 1

Figure 1:
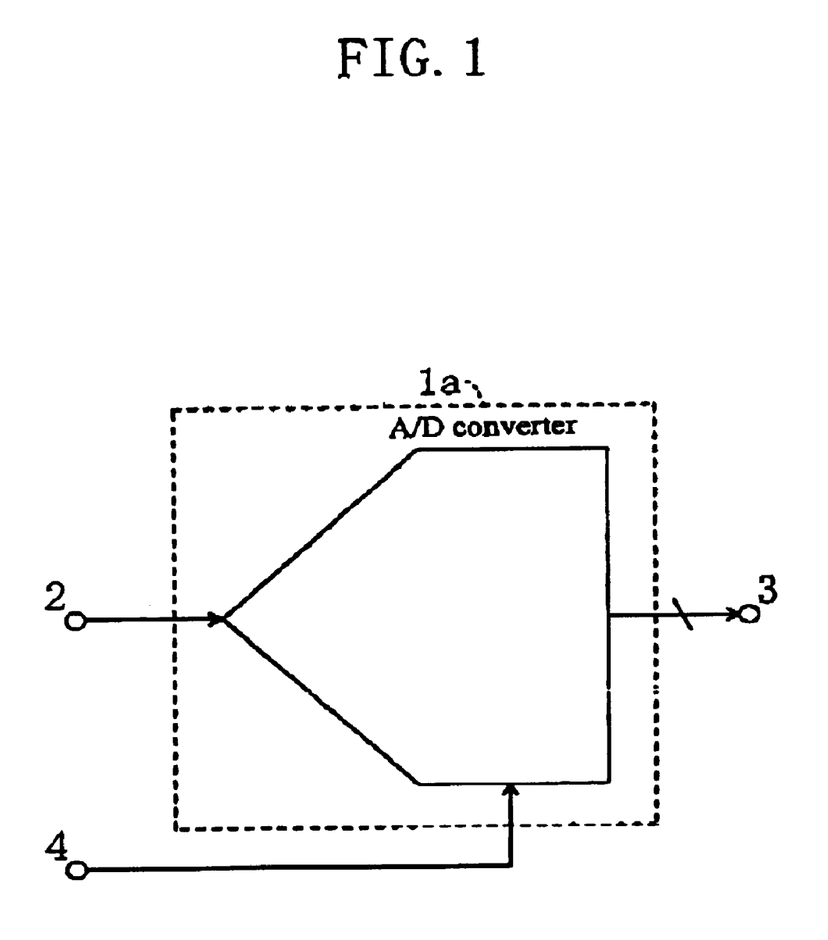
FIG. 1 is a schematic diagram of an A/D converter according to Embodiment 1 of the invention.

FIG. 1 is a diagram showing the configuration of an A/D converter according to Embodiment 1 of the present invention.

An analog input signal 2 is supplied as input to an A/D converter 1a. The A/D converter 1a outputs a digital output signal 3 according to the analog input signal 2. A control signal 4 is supplied also as input to the A/D converter 1a from outside. The A/D converter 1a according to Embodiment of the present invention is thus configured.

Next, the operation of the A/D converter 1a according to the present embodiment is explained below.

First, the analog input signal 2 is supplied as input to the A/D converter 1a. The A/D converter 1a outputs the digital output signal 3 according to the analog input signal 2. At this time, the power consumption of the A/D converter 1a is controlled by the control signal 4. The power consumption and performance of the A/D converter 1a are approximately correlated to each other, and therefore, the performance of the A/D converter 1a can be changed by controlling the power consumption of the A/D converter 1a.

Thus, according to the present embodiment, the power consumption of the A/D converter 1a can be changed with the external control signal 4, and as a consequence, the performance of the A/D converter 1a can be changed. Therefore, it is possible to reduce the power consumption of the system as a whole that contains the A/D converter 1a.

It should be noted that the control signal 4 may be any of analog signal, digital signal, or the combinations thereof The conversion system of the A/D converter 1a may be any of flash type, 2-step flash type, subranging type, successive approximation type, integral type, or pipeline type.

Embodiment 2

Figure 2:
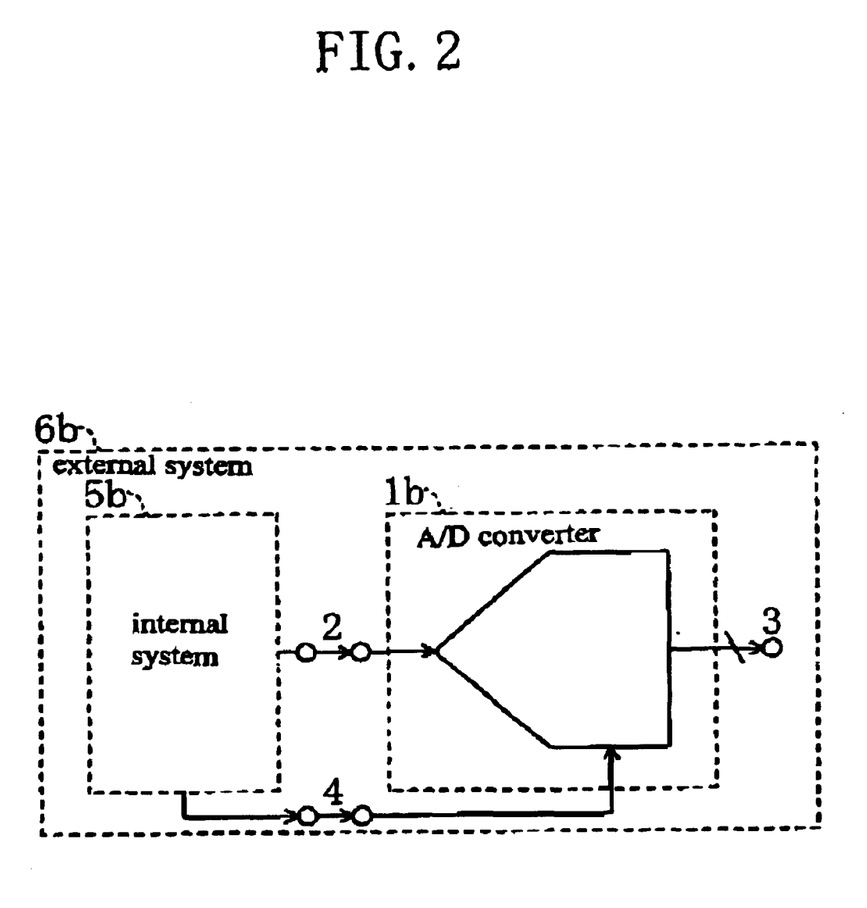
FIG. 2 is a schematic diagram of a signal processing device according to Embodiment 2 of the invention.

FIG. 2 is a diagram showing the configuration of a signal processing device according to Embodiment 2 of the present invention.

In FIG. 2, reference character 1b indicates an A/D converter, reference character 5b indicates an internal system that operates independently of the A/D converter 1b, and reference character 6b indicates an external system that incorporates the A/D converter 1b and the internal system 5b inside. An analog input signal 2 is supplied as input to the A/D converter 1b from the internal system 5b. The A/D converter 1b outputs a digital output signal 3 according to the analog input signal 2. A control signal 4 is supplied also as input to the A/D converter 1b from the internal system 5b. The signal processing system according to Embodiment 2 of the present invention is thus configured.

Next, the operation of the signal processing device according to the present embodiment is described below.

First, the analog input signal 2 is supplied as input to the A/D converter 1b from the internal system 5b. The A/D converter 1b outputs the digital output signal 3 according to the analog input signal 2. At the same time, the control signal 4 that contains information about the required performance of the A/D converter 1b is supplied as input to the A/D converter 1b from the internal system 5b. At this time, the power consumption of the A/D converter 1b is controlled by the control signal 4. The power consumption and performance of the A/D converter 1b are approximately correlated to each other, and therefore, the performance of the A/D converter 1b can be changed by controlling the power consumption of the A/D converter 1b.

Thus, according to the present embodiment, the power consumption of the A/D converter 1b can be changed according to the performance that is required by the system. Therefore, it is possible to reduce the power consumption of the overall system.

Embodiment 3

Figure 3:
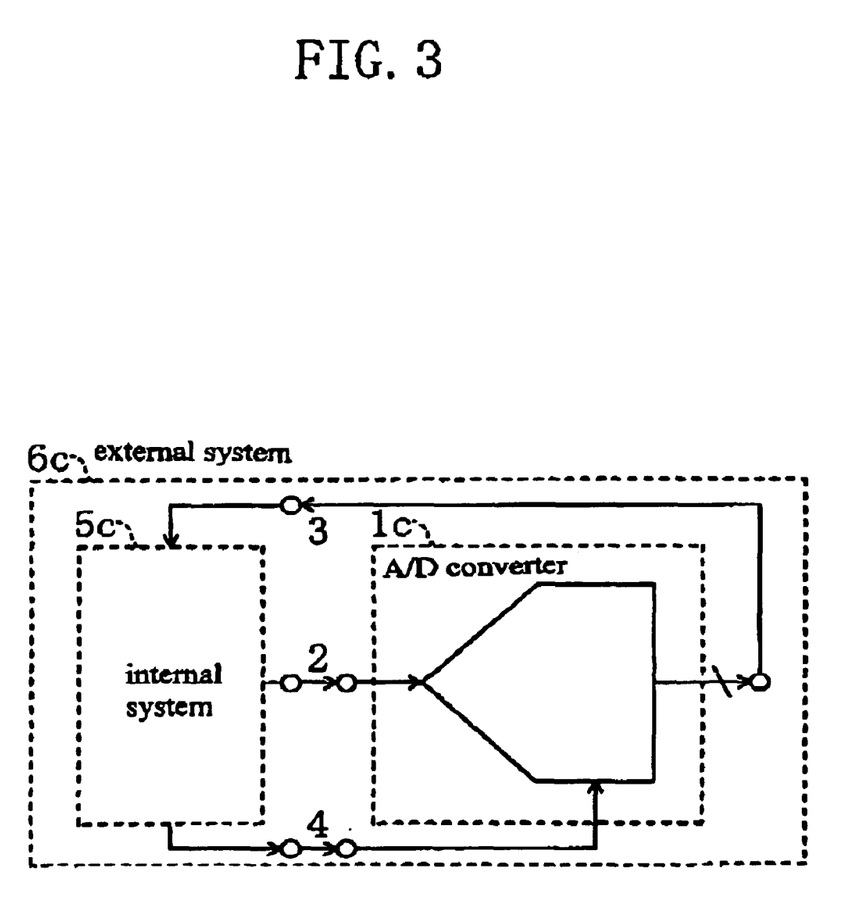
FIG. 3 is a schematic diagram of a signal processing device according to Embodiment 3 of the invention.

FIG. 3 is a diagram showing the configuration of a signal processing device according to Embodiment 3 of the present invention.

In FIG. 3, reference character 1c indicates an A/D converter, reference character 5c indicates an internal system that operates independently of the A/D converter 1c, and reference character 6c indicates an external system that incorporates the A/D converter 1c and the internal system 5c inside. An analog input signal 2 is supplied as input to the A/D converter 1c from the internal system 5c. The A/D converter 1c outputs a digital output signal 3 according to the analog input signal 2. The resulting digital output signal 3 is fed back to the internal system 5c. A control signal 4 is supplied also as input to the A/D converter 1c from the internal system 5c. The signal processing system according to Embodiment 3 of the present invention is thus configured.

Next, the operation of the signal processing device according to the present embodiment is described below.

First, the analog input signal 2 is supplied as input to the A/D converter 1c from the internal system 5c. The A/D converter 1c outputs the digital output signal 3 according to the analog input signal 2. At the same time, the control signal 4 that contains information about a required performance of the A/D converter 1c is supplied as input to the A/D converter 1c from the internal system 5c. Meanwhile, the digital output signal 3 is fed back to the internal system 5c. The internal system 5c again outputs the control signal 4 according to the digital output signal 3. The control signal 4 is supplied as input to the A/D converter 1c. At this time, the power consumption of the A/D converter 1c is controlled by the control signal 4. The power consumption and performance of the A/D converter 1c are approximately correlated to each other, and therefore, the performance of the A/D converter 1c can be changed by controlling the power consumption of the A/D converter 1c.

Thus, according to the present embodiment, the power consumption of the A/D converter 1c can be reduced to the minimum level that is required by the overall system. Therefore, it is possible to optimize the power consumption and performance of the A/D converter 1c and reduce the power consumption of the overall system.

Embodiment 4

Figure 4:
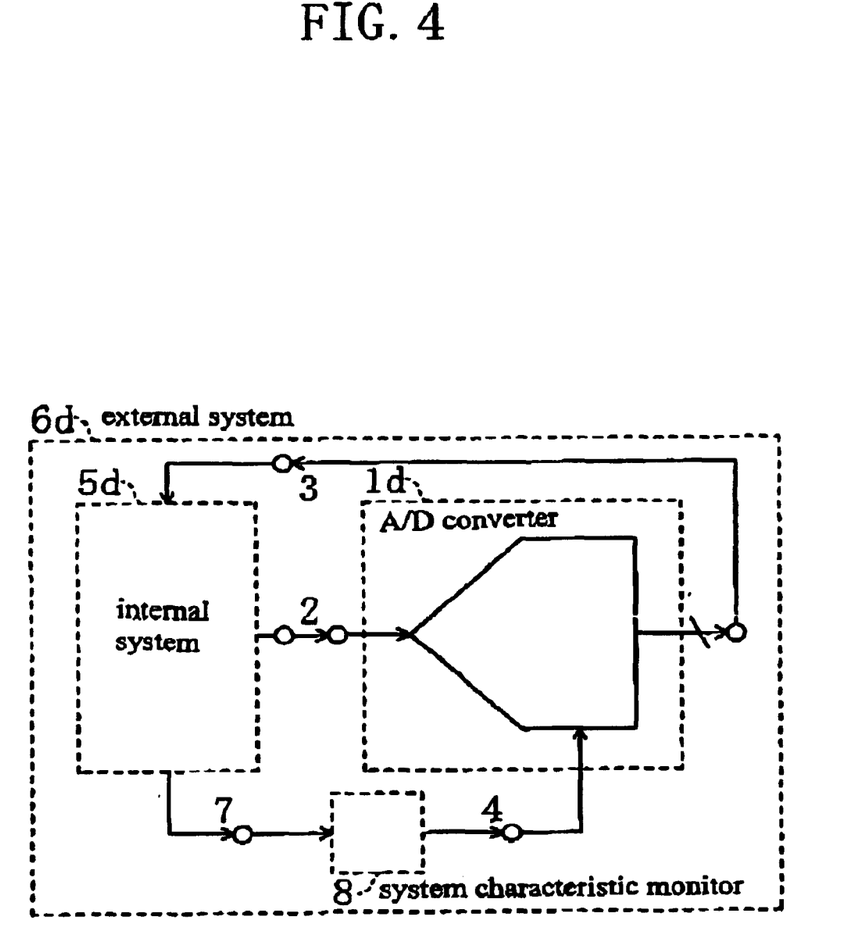
FIG. 4 is a schematic diagram of a signal processing device according to Embodiment 4 of the invention.

FIG. 4 is a diagram showing the configuration of a signal processing device according to Embodiment 4 of the present invention.

In FIG. 4, reference character Id indicates an A/D converter, reference character 5d indicates an internal system that operates independently of the A/D converter 1d, reference character 6d indicates an external system that incorporates the A/D converter 1d and the internal system 5d inside, and reference character 8 indicates a system characteristic monitor. An analog input signal 2 is supplied as input to the A/D converter 1d from the internal system 5d. The A/D converter 1d outputs a digital output signal 3 according to the analog input signal 2. The resulting digital output signal 3 is fed back to the internal system 5d. Meanwhile, an internal system characteristic 7 is supplied from the internal system 5d to the system characteristic monitor 8. The system characteristic monitor 8 outputs a control signal 4 according to the internal system characteristic 7. A control signal 4 is supplied as input to the A/D converter Id from the system characteristic monitor 8. The signal processing system according to Embodiment 4 of the present invention is thus configured.

Next, the operation of the signal processing device according to the present embodiment is described below.

First, the analog input signal 2 is supplied as input to the A/D converter 1d from the internal system 5d. The A/D converter 1d outputs the digital output signal 3 according to the analog input signal 2. At the same time, the internal system characteristic 7 is supplied as input to the system characteristic monitor 8 from the internal system 5d. Upon receiving the internal system characteristic 7, the system characteristic monitor 8 outputs the control signal 4 to the A/D converter id. Meanwhile, the digital output signal 3 is fed back to the internal system 5d. The internal system 5d again outputs the internal system characteristic 7 according to the digital output signal 3, and supplies this as input to the system characteristic monitor 8. At this time, the power consumption of the A/D converter 1d is controlled by the control signal 4 that is supplied from the system characteristic monitor 8. The power consumption and performance of the A/D converter 1d are approximately correlated to each other, and therefore, the performance of the A/D converter 1d can be changed by controlling the power consumption of the A/D converter 1d.

Thus, according to the present embodiment, the performance of the A/D converter 1d can be reduced to the minimum level that is required by the overall system by monitoring the system performance that varies according to the performance of the A/D converter 1d. Therefore, it is possible to optimize the power consumption and performance of the A/D converter 1d and reduce the power consumption of the overall system.

Embodiment 5

Figure 5:
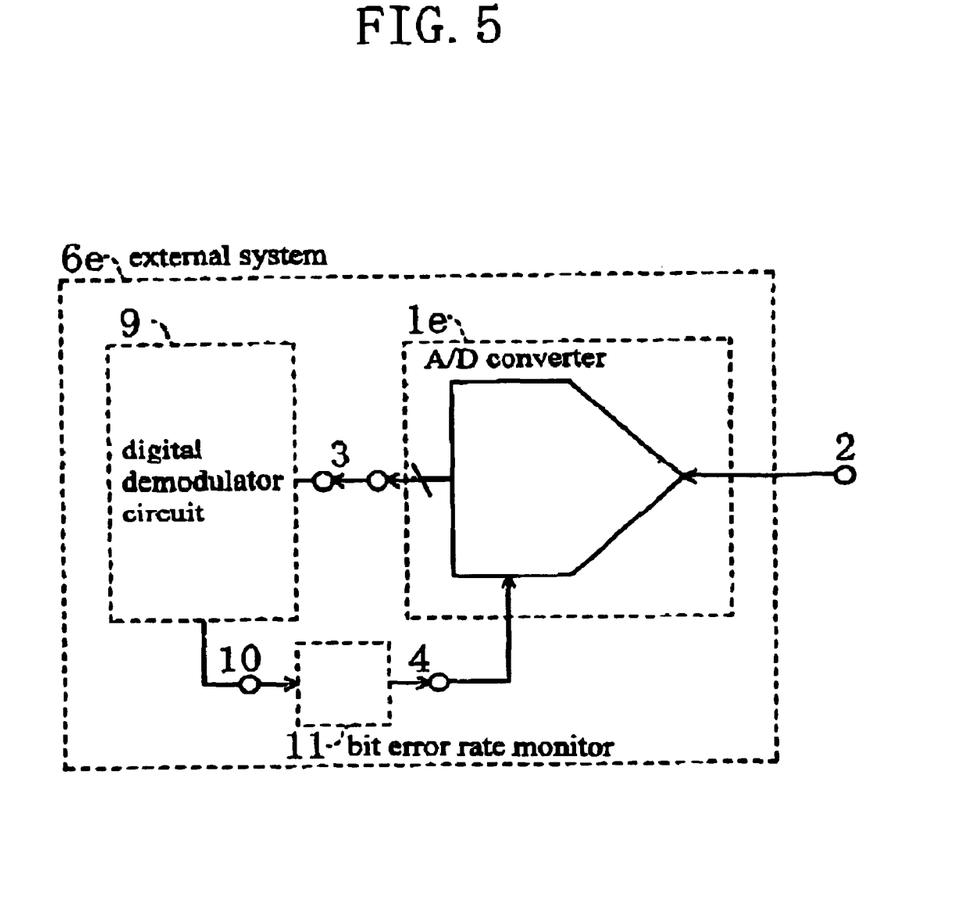
FIG. 5 is a schematic diagram of a signal processing device according to Embodiment 5 of the invention.

FIG. 5 is a diagram showing the configuration of a signal processing device according to Embodiment 5 of the present invention. This signal processing device can be used, for example, for such cases that a radio wave signal containing video and audio information is received, and then the received radio wave signal is subjected to A/D conversion and digitally demodulated, such as in digital televisions or the like.

In FIG. 5, reference character 1e indicates an A/D converter; reference character 9 indicates a digital demodulator circuit serving as a signal processing means, in which part of the performance is determined by the resolution of the A/D converter 1e; reference character 6e indicates an external system that incorporates the A/D converter 1d and the digital demodulator circuit 9 inside; and reference character 11 indicates a bit error rate monitor serving as a monitoring means. The bit error rate monitor 11 monitors the performance of the digital demodulator circuit 9 attributable to the resolution of the A/D converter 1e, and instructs the A/D converter to increase the resolution if a decrease of the performance is detected and instructs the A/D converter to reduce the resolution if an overhead of the performance is detected An analog input signal that is supplied to the external system 6e is supplied as input to the A/D converter 1e. The A/D converter 1e outputs a digital output signal 3 according to the analog input signal 2. The resulting digital output signal 3 is supplied to the digital demodulator circuit 9. Meanwhile, the bit error rate 10 is supplied from the digital demodulator circuit 9 to the bit error rate monitor 11. The bit error rate monitor 11 outputs a control signal 4. The control signal 4 is supplied to the A/D converter 1e. The signal processing system according to Embodiment 5 of the present invention is thus configured.

Next, the operation of the signal processing device according to the present embodiment is described below.

First, the analog input signal 2 that is supplied to the external system 6e is supplied as input to the A/D converter 1e. The A/D converter 1e outputs the digital output signal 3 according to the analog input signal 2. The digital output signal 3 is supplied to the digital demodulator circuit 9. The digital demodulator circuit 9 performs digital demodulation and error correction according to the digital output signal 3. By performing the error correction, a bit error rate 10 is obtained from the digital demodulator circuit 9. The bit error rate 10 changes according to the status of radio wave reception and the performance of the A/D converter 1e. In other words, if the status of radio wave reception degrades or if the performance of the A/D converter decreases, the bit error rate 10 deteriorates. If the bit error rate 10 deteriorates, the bit error monitor 11 outputs the control signal 4 such that the power consumption of the A/D converter 1e increases, until the bit error rate 10 reaches a predetermined value. On the other hand, if the bit error rate 10 improves, the bit error monitor 11 outputs the control signal 4 such that the power consumption of the A/D converter 1e reduces, until the bit error rate 10 reaches the predetermined value. Next, the resulting control signal 4 is supplied to the A/D converter 1e. At this time, the power consumption of the A/D converter 1e is controlled by the control signal 4. The power consumption and performance of the A/D converter 1e are approximately correlated to each other, and therefore, the performance of the A/D converter 1e can be changed by controlling the power consumption of the A/D converter 1e.

Thus, according to the present embodiment, it is possible to reduce the performance of the A/D converter 1e to the minimum level that is required by the digital demodulator circuit 9 by monitoring the bit error rate 10 that is output from the digital demodulator circuit 9. Therefore, the power consumption and performance of the A/D converter 1e can be optimized, and the power consumption of the overall system can be reduced.

Embodiment 6

Figure 6:
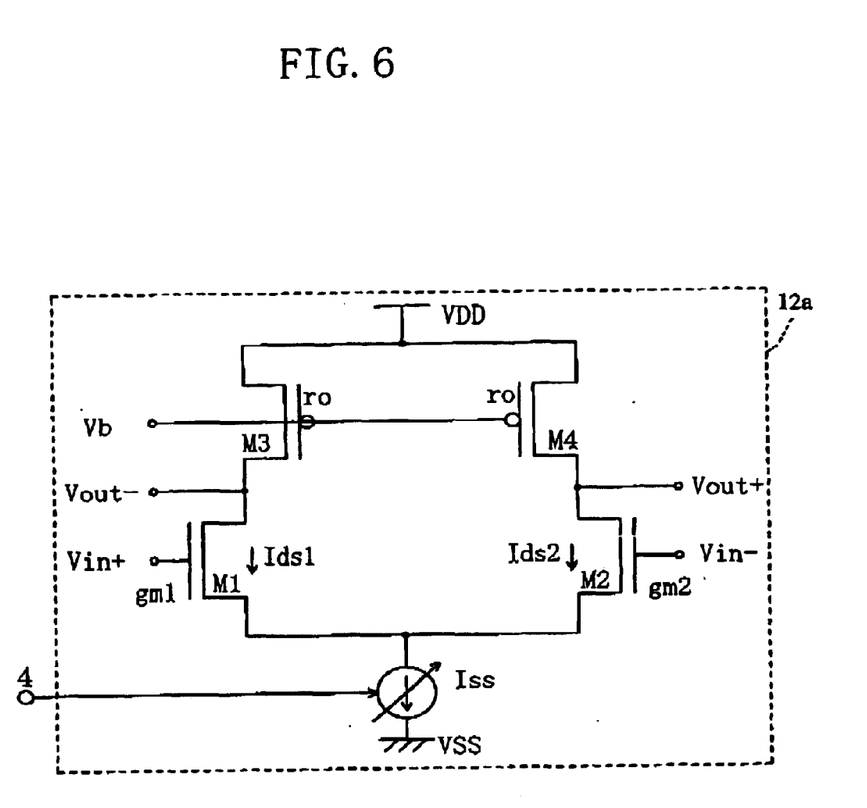
FIG. 6 is a schematic diagram of an operational amplifier in an A/D converter according to Embodiment 6 of the invention.

FIG. 6 shows a differential input-differential output operational amplifier 12a as an example of the operational amplifier incorporated in an A/D converter according to Embodiment 6.

In FIG. 6, reference character Iss indicates a variable current source, reference characters M1 and M2 indicate N-channel transistors, and M3 and M4 indicate P-channel transistors.

It should be noted that, in an A/D converter, an operational amplifier is mainly used as a sample-and-hold circuit, a voltage comparator, and a circuit for adjusting the input range between the stages in a pipeline A/D converter or in a subranging A/D converter.

One end of the variable current source Iss is connected to a reference voltage VSS, while the other end is connected to the source terminals of the N-channel transistors M1 and M2. The gate terminals of the N-channel transistors M1 and M2 are respectively connected an analog differential input signal-positive electrode Vin$^+$ and an analog differential input signal-negative electrode Vin$^-$. The gate terminals of the P-channel transistors M3 and M4 are connected a bias voltage Vb. The source terminals of the P-channel transistors M3 and M4 are connected to a power supply voltage VDD. The drain terminals of the N-channel transistor M1 and the P-channel transistor M3 are respectively connected an analog differential output signal-negative electrode Vout$^-$, whereas the drain terminals of the N-channel transistor M2 and the P-channel transistor M4 are respectively connected an analog differential output signal-positive electrode Vout$^+$. The operational amplifier 12a incorporated in the A/D converter according to Embodiment 6 of the invention is thus configured.

Next, the operation of the operational amplifier 12a incorporated in the A/D converter according to the present embodiment is described below.

Where an analog differential input signal is $\Delta Vin=(Vin^+-Vin^-)$ and an analog differential output signal is $\Delta Vout=(\Delta Vout^+-\Delta Vout^-)$, a voltage gain G of the present circuit is obtained by the following equation: $G=\Delta Vout/\Delta Vin=gm \cdot ro$, as described previously. In other words, the voltage gain G of the operational amplifier 12a is proportional to the transconductance gm of the N-channel transistors M1 and M2, which are input transistors. The transconductance gm is approximately proportional to the drain-source current Ids flowing in the N-channel transistors M1 and M2. In the above equations, gm=gm1=gm2, where gm1 denotes the transconductance of the N-channel transistor M1, and gm2 denotes the transconductance of the N-channel transistor M2. In addition, ro denotes the dynamic resistance of the output terminal.

As the variable current source Iss is increased, the drain-source currents Ids1 and Ids2 increase. On the other hand, as the variable current source Iss is reduced, the drain-source currents Ids1 and Ids2 decrease. Therefore, when the variable current source Iss is increased, the voltage gain G increases, whereas when the variable current source Iss is reduced, the voltage gain G decreases.

The increase or decrease of the voltage gain G causes a corresponding increase or decrease of the frequency band characteristic and the offset error characteristic of the operational amplifier 12a. In other words, the characteristics of the operational amplifier 12a can be correspondingly varied by changing the variable current source Iss, and as a consequence, the performance of the A/D converter is also varied correspondingly.

Thus, the power consumption and performance of the A/D converter can be controlled by making the current flowing through the operational amplifier 12a used in the A/D converter variable.

It should be noted that the present embodiment has described the operational amplifier in which the input terminal is the gate terminal of the N-channel transistor, but of course, similar effects can be obtained for the operational amplifier in which the input terminal is the gate terminal of the P-channel transistor.

Moreover, it should be noted that the present embodiment has described a simple differential input-differential output operational amplifier, but similar effects can be obtained for current-biased type operational amplifies that are differential input-single output operational amplifiers, single input-single output operational amplifiers, single input-differential output operational amplifiers, and even more complicated operational amplifiers.

Figure 7:
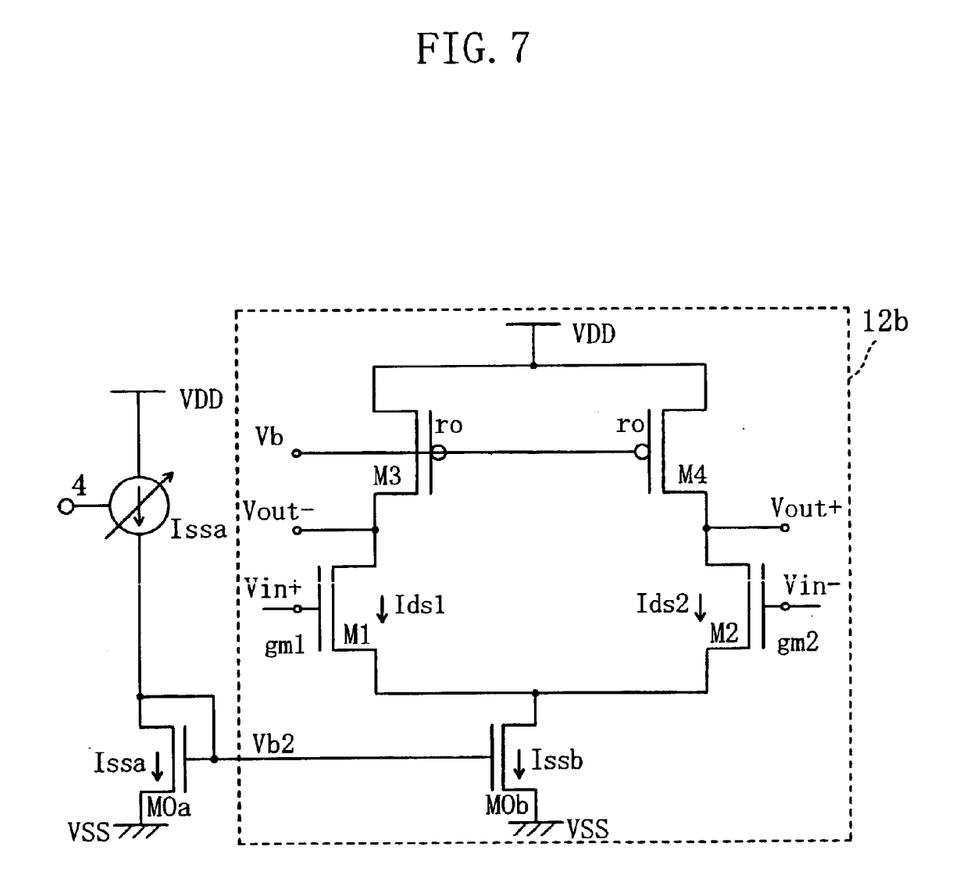
FIG. 7 is a modified example of the operational amplifier of FIG. 6.

In addition, a configuration as shown in FIG. 7 is also possible. In this configuration, an N-channel transistor M0a and an N-channel transistor M0b form a current mirror circuit to make the current Issa in the bias circuit variable. In the configuration of FIG. 7, the current Issb flowing through the N-channel transistor M0b is such that a variable current source output Issa is multiplied by the current mirror ratio. The current Issb then becomes the bias current of the operational amplifier 12b, and consequently, similar effects to those described above can be obtained.

FIG. 7 shows that N-channel transistors are used for forming the current mirror circuit. However, depending on circuit configurations, it is also possible to form a current mirror circuit using P-channel transistors. In addition, although FIG. 7 shows a single type current mirror circuit, a cascade type current mirror circuit can attain similar effects to those described above.

Figure 8:
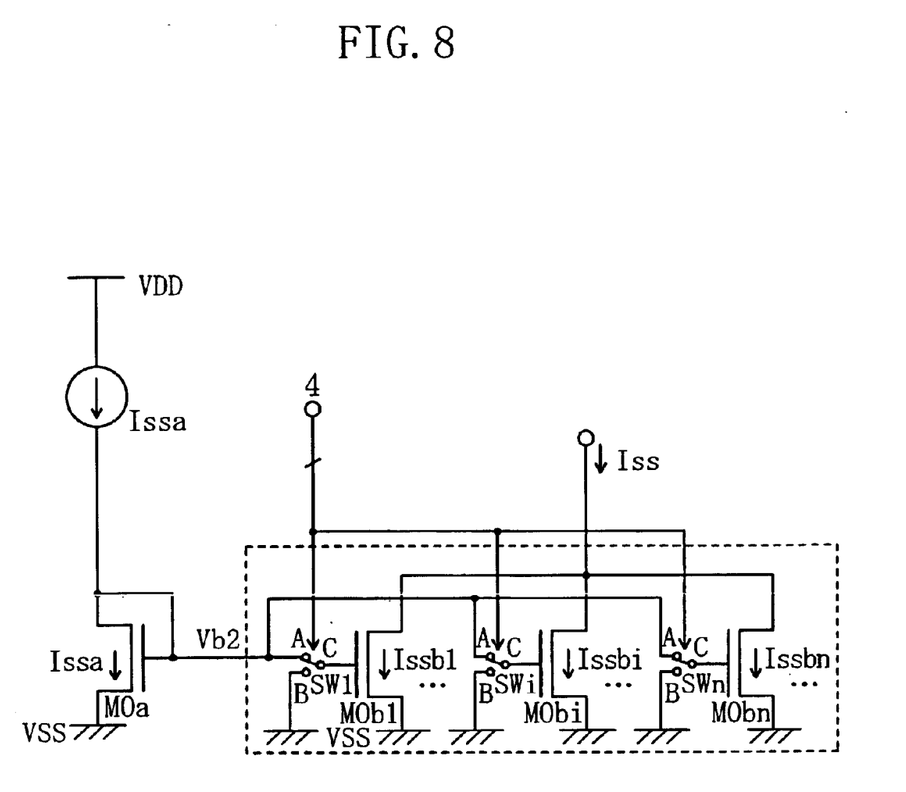
FIG. 8 is a schematic diagram of the current mirror circuit as a variable current supply in an A/D converter according to Embodiment 6.

The variable current supply Iss shown in FIGS. 6 and 7 can be attained by a circuit as shown in FIG. 8. As shown in FIG. 8, one end of the constant current source Issa is connected to a reference voltage VDD, whereas the other end is connected to the drain terminal and the gate terminal of an N-channel transistor M0a. The source terminal of the N-channel transistor M0a is connected to the reference voltage VSS. The source terminals of N-channel transistors M0b1 to M0bn are connected to the reference voltage VSS, whereas the drain terminals thereof are connected to each other. The gate terminals of the N-channel transistors M0b1 to M0bn are connected to output terminals C of switches SW1 to SWn. An input terminal A of each of the switches SW1 to SWn is connected to the gate terminal and the drain terminal of the N-channel transistor M0a. An input terminal B of each of the switches SW1 to SWn is connected to the reference voltage VSS. By bringing the input terminal A and the output terminal C of the switch SW1 into a conductive state, the N-channel transistor M0a and the N-channel transistor M0bi form a current mirror circuit. Thus, current Issbi, which is the current Issa that is multiplied by the current mirror ratio, flows between the drain and the source of the N-channel transistor M0bi. On the other hand, by brining the input terminal B and the output terminal C of the switch SWi, the N-channel transistor M0bi is switched to an OFF state and current does not flow between the drain and the source. By selecting the input terminal A or the input terminal B in each of the switches SW1 to SWn with the control signal 4, it is possible to determine the variable current source Iss is to be any one of Issb1 to Issbn or the combinations thereof, or to be 0. With this configuration, it is possible to attain the variable current source Iss.

It should be noted that, although FIG. 8 describes a current mirror circuit that is constructed using N-channel transistors, similar effects to those described above can be obtained by constructing a current mirror circuit using P-channel transistors.

Embodiment 7

Figure 9:
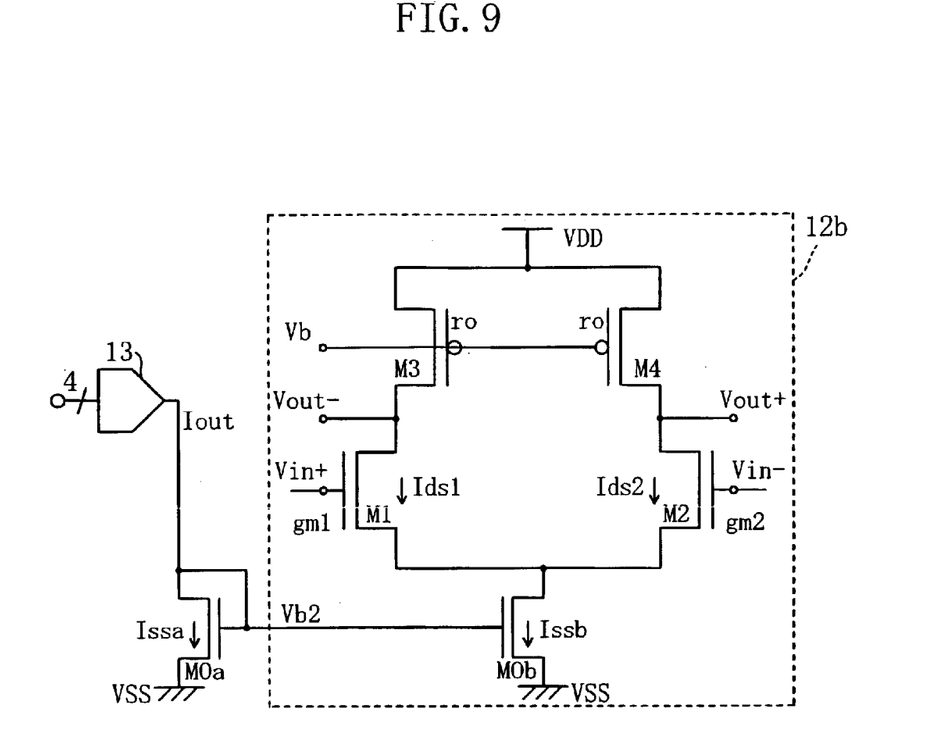
FIG. 9 is a schematic diagram showing an operational amplifier in an A/D converter according to Embodiment 7 of the invention.

FIG. 9 is a diagram showing an example of the operational amplifier incorporated in an A/D converter according to Embodiment 7 of the present invention. Reference character 12b denotes a differential input-differential output operational amplifier, reference characters M0a, M0b, M1, and M2 denote N-channel transistors, reference characters M3 and M4 denote P-channel transistors, reference character 4 denotes a control signal, and reference character 13 denotes a current output type D/A converter.

The control signal 4 is input to the D/A converter 13. The N-channel transistors M0a and M0b form a current mirror circuit. The source terminal of the N-channel transistor M0b is connected to a reference voltage VSS. The drain terminal thereof is connected to the source terminals of the N-channel transistors M1 and M2. The gate terminals of the N-channel transistors M1 and M2 are respectively connected to an analog differential input signal-positive electrode Vin$^+$ and an analog differential input signal-negative electrode Vin$^-$. The gate terminals of the P-channel transistors M3 and M4 are connected to a bias voltage Vb. The source terminals of the P-channel transistors M3 and M4 are connected to a power source voltage VDD. The drain terminals of the N-channel transistor M1 and the P-channel transistor M3 are connected to the analog differential output signal-negative electrode Vout$^-$. The drain terminals of the N-channel transistor M2 and the P-channel transistor M4 are connected to the analog differential output signal-positive electrode Vout$^+$. The operational amplifier 12b incorporated in the A/D converter according to Embodiment 7 is thus configured.

Next, the operation of the operational amplifier 12b incorporated in the A/D converter according to the present embodiment is described below.

First, the control signal 4 is supplied to the D/A converter 13. The D/A converter 13 outputs a current Iout that is uniquely determined for the control signal 4. The output current Iout flows from the drain terminal of the N-channel transistor M0a into the reference voltage VSS. Since the N-channel transistors M0a and M0b form a current mirror circuit, a current Issb, which the current Issa that is multiplied by the current mirror ratio, flows from the drain terminal of the N-channel transistor M0b into the reference voltage VSS. The current Issb becomes the bias current of the operational amplifier 12b.

Thus, according to the present embodiment, it is made possible to control the current that flows in the operational amplifier 12b incorporated in the A/ID converter according to the control signal 4 input to the D/A converter 13, according to the gradation of the D/A converter 13. As a result, the power consumption and performance of the A/D converter can be controlled.

The present embodiment describes a current output D/A converter, but a voltage output D/A converter can also attain similar effects to those described above by performing voltage-current conversion using a resistive load.

Embodiment 8

Figure 10:
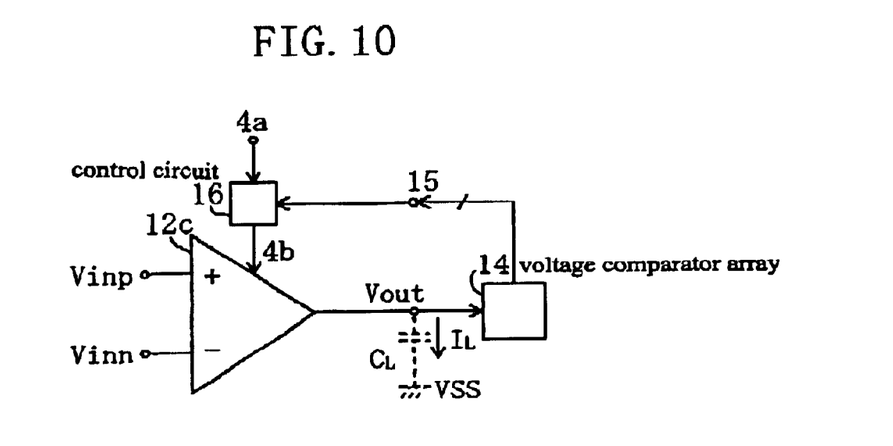
FIG. 10 is a schematic diagram showing an A/D converter according to Embodiment 8 of the invention.

FIG. 10 is a diagram showing an A/D converter according to Embodiment 8 of the present invention.

In FIG. 10, reference character 16 denotes a control circuit serving as a controlling means that determines a resolution, reference character 12c denotes an operational amplifier that changes current with a signal from the control circuit 16, reference character 14 denotes a voltage comparator array to which an output from the operational amplifier 12c is input. This A/D converter is so configured that the resolution is corrected by inputting the result of comparison in the voltage comparator array 14 into the control circuit 16. The operational amplifier 12c of the A/D converter is supplied as test voltage with an input voltage signal Vinp and an input voltage signal Vinn. The voltage comparator array 14 receives as input an output voltage signal Vout from the operational amplifier 12c and outputs a voltage comparator array output 15. The control circuit 16 receives as input the voltage comparator array output 15 and a control signal 4a. A control signal 4b, which is the output from the control circuit 16, is supplied to the operational amplifier 12c. The A/D converter according to Embodiment 8 is thus configured. The A/D converter according to the present embodiment is such that it determines the amount of current flowing through the operational amplifier 12c during an initial operation period.

Figure 11:
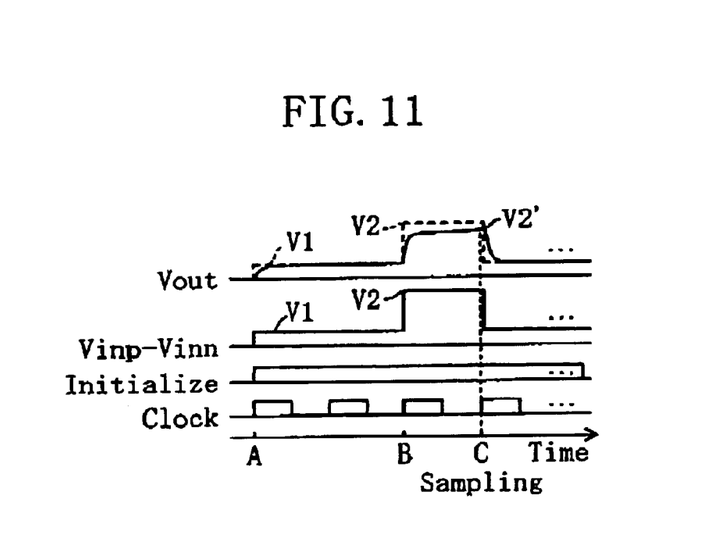
FIG. 11 is a timing chart of an A/D converter according to Embodiment 8.
Figure 12:
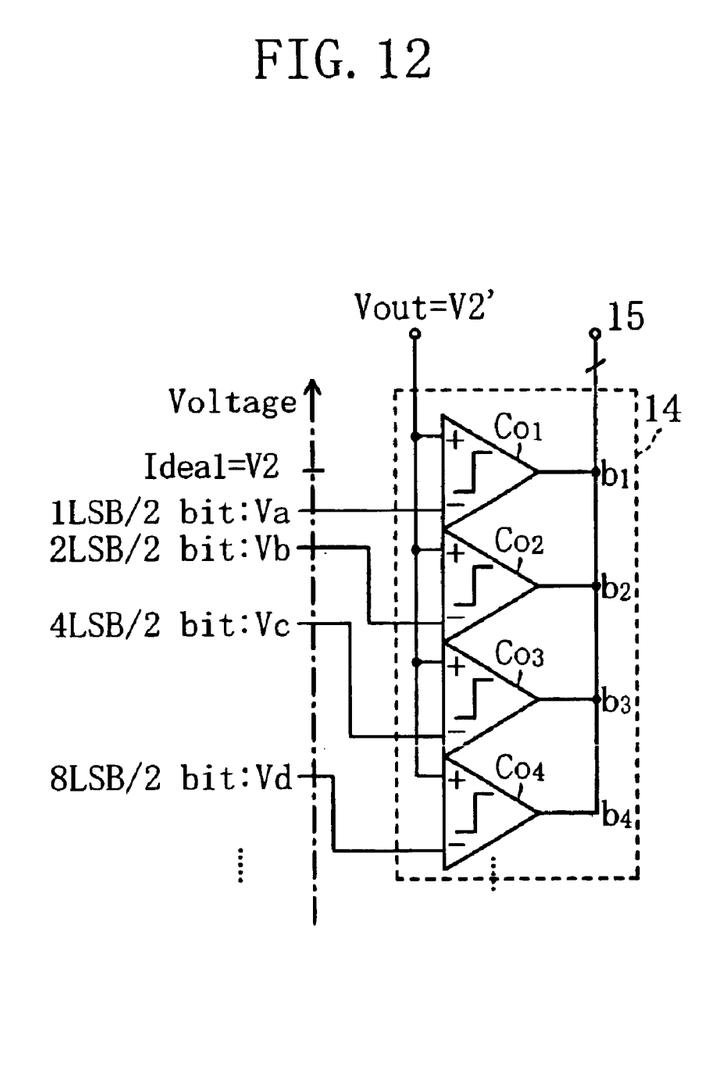
FIG. 12 shows a voltage comparator array in an A/D converter according to Embodiment 8.

Next, the operation of the A/D converter according to the present embodiment is described with reference to FIG. 11 showing a timing chart and FIG. 12 showing a detailed illustration of the voltage comparator array 14.

First, it should be noted that the initial operation period of the A/D converter that the system requires corresponds to a period during which a signal Initialize shown in FIG. 11 is high. During the initial operation period, an input signal (Vinp−Vinn) is changed from V1 to V2 in synchronization with Clock. Additionally, when an input voltage is V1, a sufficient settling time (a period from A to B in FIG. 11) is given to the operational amplifier 12c.

Next, the input voltage is changed to V2. However, a current IL leaks a little to a load capacitance CL that is present at the output end of the operational amplifier 12c, and for this reason, an output voltage signal Vout from the operational amplifier 12c does not immediately change to the voltage level V2 but changes gradually as shown in FIG. 11. Then, a sampling is performed at the operation timing (indicated by C in FIG. 11) at which A/D conversion is carried out. Where the voltage level of the output voltage signal Vout at this point is V2', a settling error is represented by V2−V2'. The term "setting error" herein means the difference between a voltage level V2 and an output voltage level V2' that is actually output. Under this condition, voltage levels Va to Vd are compared with the voltage level V2', using comparators Co1 to Co4. It should be noted that the voltage levels Va to Vd are levels that correspond to the errors 1LSB/2, 2LSB/2, 4LSB/2, and 8LSB/2, respectively, when the voltage level V2 is an ideal value.

The settling error is detected with the voltage comparator array output 15. On the other hand, the control signal 4a has information about the precision of the operational amplifier that is necessary to construct an A/D converter having a certain precision, which is supplied to the controlling circuit 16. Generally, the settling error is correlated to the reciprocal of the current flowing through the operational amplifier 12c. Specifically, the larger the current flowing through the operational amplifier 12c is, the less the settling error, and conversely, the smaller the current flowing through the operational amplifier 12c is, the greater the settling error. Then, based on the voltage comparator array output 15, it is detected if the settling error at that time falls under 1LSB/2, 2LSB/2, 4LSB/2, or 8LSB/2. For example, when b1 and b2 are high and b3 and b4 are low, the settling error is between 4LSB/2 and 2LSB/2.

Here, when the settling error is larger than a required precision of the operational amplifier 12c that is specified by the control signal 4a and the required precision is not met, a control signal 4b is supplied from the controlling circuit 16 to the operational amplifier 12c such that the current flowing through the operational amplifier 12c is increased. As a consequence, the operation that is performed during the period from time A to time C shown in FIG. 11 is repeated. On the other hand, when the settling error is sufficiently small and the required precision specified by the control signal 4a is sufficiently met, the control signal 4b is supplied from the controlling circuit 16 to the operational amplifier 12c such that the current flowing through the operational amplifier 12c is reduced. As a consequence, the operation that is performed during the period from time A to time C shown in FIG. 11 is repeated. Further, when the settling error falls within the required precision of the operational amplifier 12c that is specified by the control signal 4a, the initial operation is ended.

According to the present embodiment, the precision of the operational amplifier 12c is detected from the settling error of the operational amplifier 12c, and the current in the operational amplifier 12c is controlled according to the control signal 4a such as to obtain the precision of the operational amplifier 12c that is necessary to achieve the precision of the A/D converter that is required by the system. Thus, it is possible to control the power consumption and performance of the A/D converter.

As has been discussed thus far, according to the present invention, when the performance of an A/D converter that is required by a system changes, the current of the operational amplifier that is incorporated in the A/D converter is controlled by a control signal. Consequently, the present invention makes it possible to change the power consumption and performance of the A/D converter corresponding to the required performance. Thus, the power consumption and performance of the A/D converter can be optimized to the optimal operation conditions according to the operation situation of the system, and the power consumption of the overall system can be reduced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A signal processing device comprising:
    an A/D converter including an amplifier, wherein the resolution of said A/D converter is made variable by changing a current flowing through the amplifier with a control signal that specifies the resolution;
    a signal processing means in which part of the performance is determined by the resolution of the A/D converter; and
    a monitoring means for monitoring the performance of the signal processing means attributable to the resolution of the A/D converter and instructing the A/D converter to increase the resolution if a decrease of the performance is detected and to reduce the resolution if an overhead of the performance is detected.

2. The signal processing device according to claim 1, wherein:
    the signal processing means is a digital demodulator circuit; and
    the performance is a bit error rate of the digital demodulator circuit.

3. A signal processing device comprising:
    an A/D converter comprising:
        a controlling means for determining a resolution;
        an amplifier for changing a current with a signal from the controlling means; and
        a voltage comparator array to which an output from the amplifier is input;
    wherein the resolution is corrected by inputting the result of the comparison in the voltage comparator array into the controlling means;
    a signal processing means in which part of the performance is determined by the resolution of the A/D converter; and
    a monitoring means for monitoring the performance of the signal processing means attributable to the resolution of the A/D converter and instructing the A/D converter to increase the resolution if a decrease of the performance is detected and to reduce the resolution if an overhead of the performance is detected.

4. The signal processing device according to claim 3, wherein:
    the signal processing means is a digital demodulator circuit; and
    the performance is a bit error rate of the digital demodulator circuit.

5. A method of A/D conversion, comprising:
    a voltage-inputting step of inputting a test voltage in an amplifier;
    a comparing step of comparing the voltage that is output from the amplifier with the test voltage; and
    a resolution-determining step of adjusting a current value of the amplifier according to the result obtained in the comparing step.

6. The method of A/D conversion according to claim 5, wherein the resolution-determining step increases the current value of the amplifier if the result obtained in the comparison step is higher than a predetermined threshold value, and decreases the current value of the amplifier if the result obtained in the comparison step is lower than the predetermined threshold value.

* * * * *